US006257901B1

(12) United States Patent
Torii

(10) Patent No.: US 6,257,901 B1
(45) Date of Patent: Jul. 10, 2001

(54) CONNECTOR STRUCTURE FOR SUBSTRATE

(75) Inventor: Chieko Torii, Shizuoka-ken (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/514,638

(22) Filed: Feb. 29, 2000

(30) Foreign Application Priority Data

Mar. 1, 1999 (JP) ........................................ 11-053235

(51) Int. Cl.[7] ........................................ H05K 1/00

(52) U.S. Cl. ........................................ 439/74

(58) Field of Search .................... 439/74, 108, 660, 439/83, 284, 295, 666, 570, 248, 247

(56) References Cited

U.S. PATENT DOCUMENTS

| | | | | |
|---|---|---|---|---|
| 4,971,565 | * | 11/1990 | Fox et al. | 439/74 |
| 5,181,855 | * | 1/1993 | Mosquera et al. | 439/74 |
| 5,876,217 | * | 3/1999 | Ito et al. | 439/74 |
| 5,904,581 | * | 6/1999 | Pope et al. | 439/74 |
| 5,915,976 | * | 6/1999 | McHugh | 439/74 |
| 5,921,787 | * | 6/1999 | Pope et al. | 439/74 |
| 5,928,003 | * | 7/1999 | Kajiunuma | 439/74 |
| 5,975,916 | * | 11/1999 | Okura | 439/74 |
| 6,045,371 | * | 4/2000 | Kagawa et al. | 439/74 |
| 6,062,875 | * | 5/2000 | Konno et al. | 439/74 |

* cited by examiner

*Primary Examiner*—Brian Sircus
*Assistant Examiner*—J. F. Duverne
(74) *Attorney, Agent, or Firm*—Finnegan, Henderson, Farabow, Garrett & Dunner, L.L.P.

(57) ABSTRACT

A small-sized connector structure is provided. The connector structure includes a male connector 3 consisting of a male housing 6 and a plurality of resilient female tabs 7. In the housing 6, a plurality of tab accommodating chambers 6*a* are formed by partition walls 13, for accommodating the tabs 7 respectively. In order to miniaturize the male housing 6, the tab accommodating chambers 6*a* are partially exposed to an exterior of the male housing 6 by removing respective outside portions of the tab accommodating chambers 6*a*.

9 Claims, 3 Drawing Sheets

CONNECTOR STRUCTURE FOR SUBSTRATE

BACKGROUND OF THE INVENTION

1. Field of the Invention

The present invention relates to a connector structure for connecting one wiring substrate with another wiring substrate through the intermediary of a female connector and a male connector under their engagement condition. Particularly, the invention relates to an improvement of the male connector constituting the connector structure.

2. Description of the Related Art

In the conventional connector structure, a female connector is attached to one substrate, while a male connector is attached to another substrate. The female connector consists of a female housing and a plurality of male tabs attached to the female housing and also soldered to the substrate through respective legs of the tabs. The male connector consists of a male housing and resilient female tabs accommodated in rectangular tab chambers formed in the male housing. The female tabs has respective legs soldered to the substrate. When the male connector is inserted into the female housing of the female connector, the male tabs are engaged in resilient portions of the female tabs, so that the male and female tabs are electrically connected with each other.

Since the rectangular tab chambers are successively formed in the male housing of the connector structure, the male housing is provided, on both sides of opposing sidewalls of short widths, with outer sidewalls of long widths. The formation of the outer sidewalls of long widths causes the male connector to be large-sized as much. Correspondingly, there is a problem that the female connector is also large-sized.

SUMMARY OF THE INVENTION

Under the circumstances, it is therefore an object of the present invention to provide a connector structure which is miniaturized by improving the structure of the male housing.

According to the first aspect of the invention, the object of the present invention described above can be accomplished by a connector structure having a male connector attached to a substrate and a female connector attached to another substrate for engagement with the male connector, both of the substrates being connectable with each other through the male connector and the female connector under engagement condition, the mail connector of the connector structure comprising:

- a male housing in which a plurality of tab accommodating chambers are successively defined by partition walls constituting the male housing;
- a plurality of resilient female tabs to be inserted into the tab accommodating chambers and accommodated therein, respectively;
- wherein the tab accommodating chambers are partially exposed to an exterior of the male housing through respective outside portions of the tab accommodating chambers.

Since respective outside walls defining the chambers are removed for the partial exposure of the tab accommodating chambers, the width (short side) of the male housing is reduced in comparison with that of the conventional male housing having the outside walls. Therefore, the female connector and the male connector can be small-sized.

According to the second aspect of the invention, in the above-mentioned connector structure, the female connector includes a plurality of male tabs for connection with the female tabs and each of the female tabs comprises:

- a resilient part into which one of the male tabs is inserted; and
- a leg part formed integrally with a side portion of the resilient part so as to extend in one direction.

In this case, owing to the provision of the resilient part in the female tab, the electrical connection between the male connector and the female connector can be ensured by the resilient part's frictional engagement with the male tab.

According to the third embodiment, in the connector structure of the second aspect, the male housing has a plurality of butt parts formed outside respective downstream ends of the tab accommodating chambers in a direction to insert the female tabs into the tab accommodating chambers, In arrangement, the female tabs are accommodated in the tab accommodating chambers while allowing respective under faces of the resilient parts to contact with the butt parts.

Owing to the provision of the butt parts, it is possible to extend the outer edges of the resilient parts of the female tab up to a position to agree with the outer edges of the partition walls. Therefore, without decreasing the width of each resilient part, only the male housing can be small-sized.

According to the fourth aspect of the invention, in the connector structure of the third aspect, each of the female tabs further comprises a pair of projections which are formed so as to project from both edges of the leg part laterally.

In this case, the position of the female tab in the tab accommodating chamber can be ensured by the engagement of the projections with the male housing.

According to the fifth aspect of the invention, in the connector structure of the fourth aspect, each of the female tabs further comprises a pair of crimping pieces which are formed so as to project from both edges of the leg part laterally, for fastening a wire on the leg part.

In this case, the female tabs in the male connector can be also connected to the wire.

According to the sixth aspect of the invention, in the connector structure of the first aspect, the female connector includes a plurality of male tabs for connection with the female tabs and each of the female tabs comprises:

- a box part into which one of the male tabs is inserted, the box part having one side portion opened to the outside;
- a resilient part formed integrally with the box part and folded back into the box part; and
- a leg part formed integrally with a lower portion of the box part so as to extend in one direction.

According to the seventh aspect of the invention, in the connector structure of the sixth aspect, the male housing has a plurality of butt parts formed outside respective downstream ends of the tab accommodating chambers in a direction to insert the female tabs into the tab accommodating chambers.

In the arrangement, the female tabs are accommodated in the tab accommodating chambers while allowing respective bottom sides of the box parts to contact with the butt parts.

In this case, each of the female tabs is attached to the male housing under condition that the bottom side of the box part comes into contact with the butt part. During the engagement of the male tabs with the female tabs, the fitting load can be received by the butt parts thereby to prevent the box parts from being deformed.

According to the eighth aspect of the invention, in the connector structure of the seventh aspect, each of the female tabs further comprising a pair of projections which are formed so as to project from both edges of the leg part laterally, for positioning the female tab in the tab accommodating chamber.

In this case, the position of the female tab in the tab accommodating chamber can be ensured by the engagement of the projections with the male housing.

According to the ninth aspect of the invention, in the connector structure of the eighth aspect, each of the female tabs further comprises a pair of crimping pieces which are formed so as to project from both edges of the leg part laterally, for fastening a wire on the leg part.

In this case, the female tabs in the male connector can be also connected to the wire.

These and other objects and features of the present invention will become more fully apparent from the following description and appended claims taken in conjunction with the accompany drawings.

DESCRIPTION OF THE PREFERRED EMBODIMENT

Embodiments of the present invention will be described with reference to the drawings.

Figure 1:
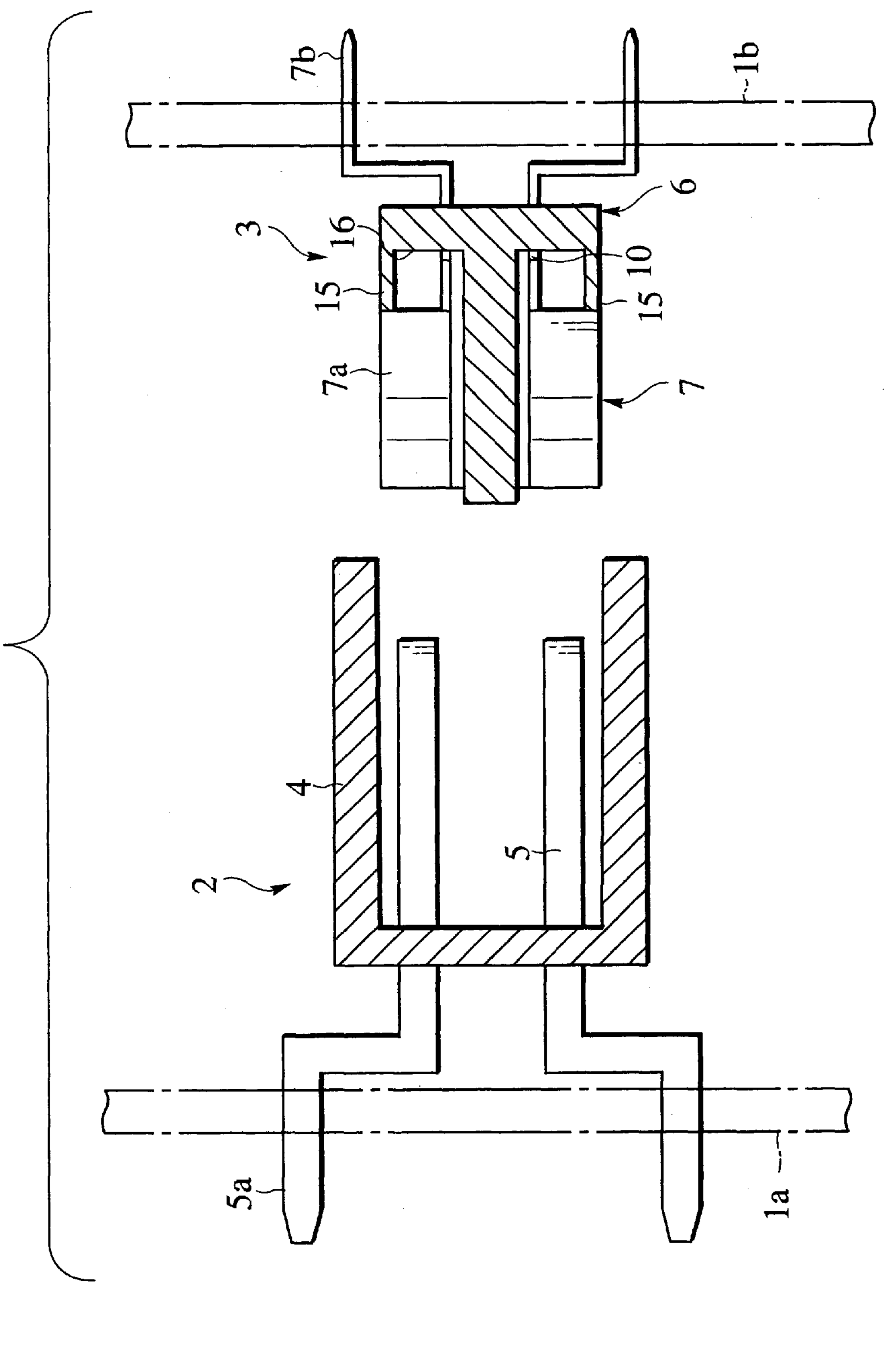
FIG. 1 is a longitudinal sectional view of a connector structure for connecting the substrates with each other, in accordance with an embodiment of the present invention.

In FIG. 1, a substrate 1*a* is equipped with a female connector 2, while another substrate 1*b* is equipped with a male connector 3. The female connector 2 includes a female housing 4 and a plurality of male tabs 5 attached to the female housing 4. Each tab 5 is soldered to the substrate 1*a* through a leg part 5*a* of the tab 5 outside the female housing 4.

The male connector 3 includes a male housing 6 and a plurality of female tabs 7 attached to the male housing 6. We now describe the detailed structure of the male connector 3 with reference to assembling drawings of FIGS. 2A and 2B. Note, FIG. 2A are perspective views of the male connector 3 in assembly, while FIG. 2B are side views of the same.

Figure 2A:
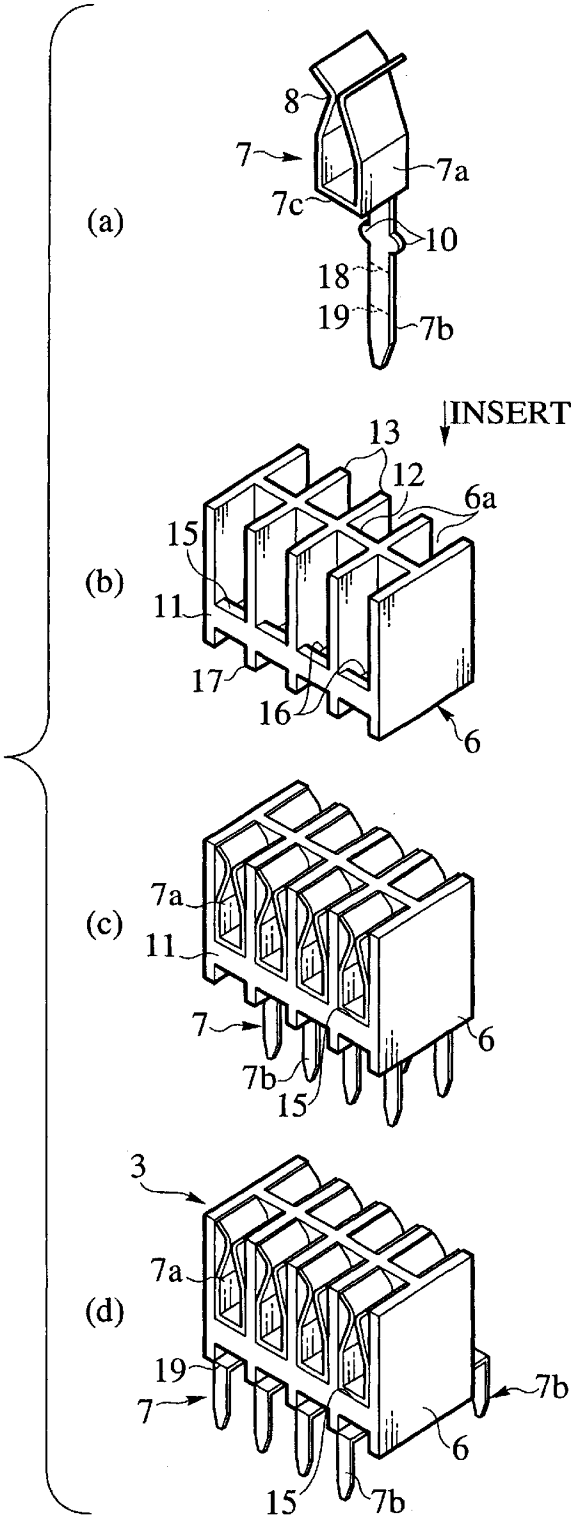
FIG. 2A are perspective views showing a process of assembling a male connector.
Figure 2B:
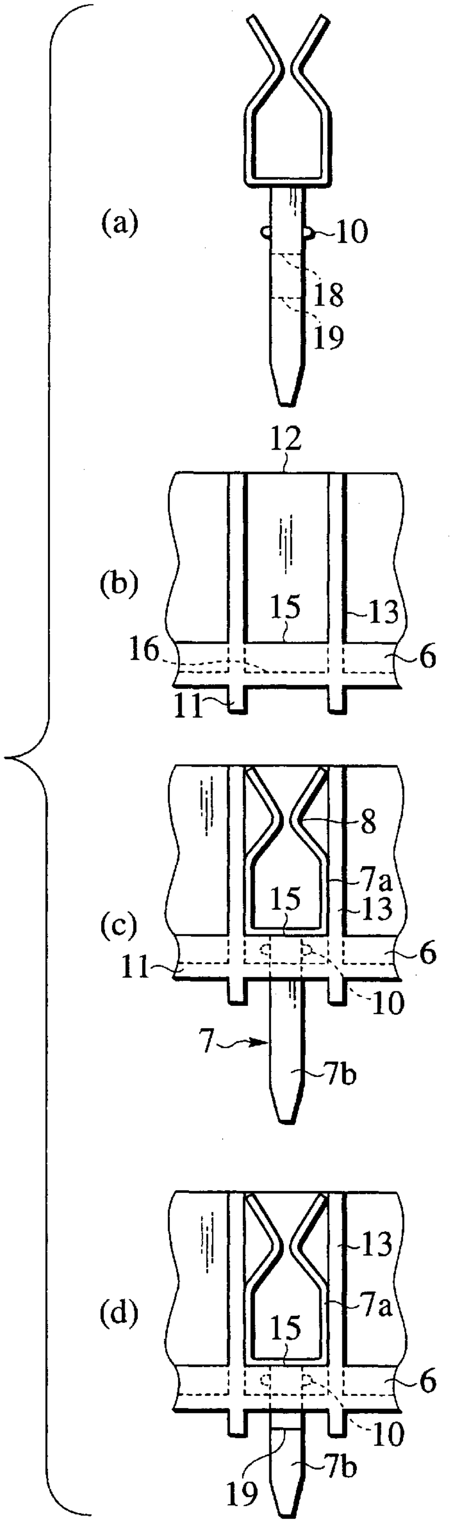
FIG. 2B are side views of the male connector corresponding to FIG. 2A.

As shown in respective sections (a) of FIGS. 2A and 2B, the female tab 7 consists of a resilient part 7*a* and a leg part 7*b* formed integrally with a side part of the resilient part 7*a*. In the resilient part 7*a*, a pair of bending portions 8 are formed to oppose each other. The leg part 7 is provided, on both sides thereof, with projections 10.

As shown in respective sections (b) of FIGS. 2A and 2B, the male housing 6 includes a center wall 12 formed on a bottom 11 to extend in the longitudinal direction of the housing 6 and a plurality of partition walls 13 formed on both sides of the center wall 12. Defined by the center wall 12 and the partition walls 13 are a plurality of tab accommodating chambers 6*a* which have their outside portions opened. On both sides of the bottom 11 in the short-width direction of the male housing 6, butt parts 15 are formed between the partitions 13. The recesses 16 are respectively formed inside the butt parts 15 (see FIG. 1). On the back face of the bottom 11, ribs 17 are formed so as to correspond to the partition walls 13, respectively.

As shown in respective sections (c) of FIGS. 2A and 2B, the leg parts 7*b* of the tabs 7 project downward through the bottom 11 by press-fitting the female tabs 7 into the tab accommodating chambers 6*a* respectively. In this state, the projections 10 of each tab 7 engage with an upper face of the bottom 11 forming each recess 16. Simultaneously, a lower face 7*c* of each resilient part 7*a* comes into contact with each butt part 15, while both faces of each resilient part 7*a* come into pressure contact with the opposing partition walls 13 for frictional engagement.

By folding the respective leg parts 7*b* along bending lines 18, 19 of the sections (a) of FIGS. 2A and 2B, there can be completed the male connector 3 shown in sections (d) of FIGS. 2A and 2B. Subsequently, the leg parts 7*b* are soldered to the substrate 1*b* of FIG. 1.

In FIG. 1, when fitting the male connector 3 into the female housing 4 of the female connector 2, the male tabs 5 are fitted into the resilient parts 7*a* of the male connector 3, so that the electrical connection between the male tabs 5 and the female tabs 7 can be completed.

The male connector 3 is similar to a structure as a result of removing the opposing outside walls from the male housing in the conventional male connector. Owing to the removal of the outside walls, the male housing 6 of the embodiment can be constructed with a reduced dimension in the short-width direction, so that it is possible to reduce the dimension of the male connector in the short-width direction. Necessarily, the dimension of the female connector 2 can be also reduced in the short-width direction thereby allowing the connector structure to be small-sized.

With the miniaturization of the connector structure, it is possible to attempt the reduction in size of the substrate and molding dies for connector thereby to accomplish the reduction in manufacturing cost. Alternatively, in case of maintaining the size of the substrate as usual, it is possible to enlarge the substrate's area allowing the printed circuit to be formed, as the connector structure is small-sized.

Since the male housing 6 has the butt parts 15 each formed between the adjoining partition walls 13, for abutment with the under face 7*c* of the resilient part 7*a* of each female tab 7, it is possible to extend respective outer edges of the resilient parts 7*a* into a position to agree with the outer edges of the partition walls 13. Accordingly, without reducing the width of each resilient part 7*a*, it is possible to reduce the dimension of shortwidth of the male housing 6.

Additionally, the resilient parts 7*a* of the respective female tabs 7 are fitted to the male housing 6 while the under faces 7*c* come in contact with the butt parts 15. Therefore, a fitting load, which originates in the engagement (see FIG. 1) of the female tabs 7 with the male tabs 5, can be caught by the butt parts 15, so that the resilient parts 7*a* can be prevented from being deformed.

Figure 3:
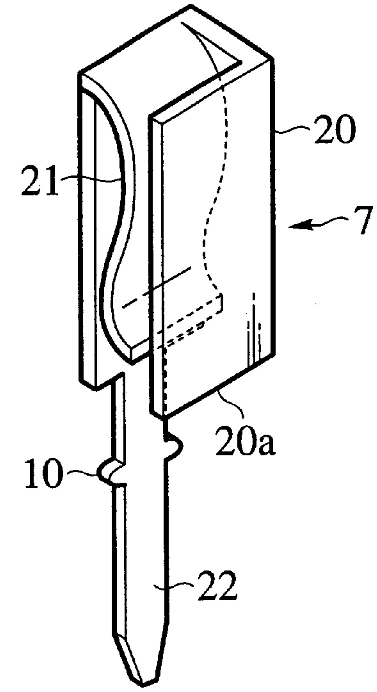
FIG. 3 is a perspective view of a female tab in accordance with another embodiment of the invention.

In another form of the female tab 7, FIG. 3 shows a tab structure in the form of a box-spring. According to the embodiment, the female tab 7 is provided with a box part 20 having one opened side. A leg part 22 is formed integrally with the lowest portion of the box part 20. A resilient part 21 in integral with the upper portion of the box part 20 is folded back into the box part 20. In the so-constructed female tab 7, a bottom side 20*a* of the box part 20 comes into contact with the butt part 15 of the male housing 6, while the box part 20 is interposed between the partition walls 13 frictionally.

Repeatedly, since the box part 20 of the female tab 7 is fitted in the housing while the bottom side 20*a* comes in contact with the butt part 15 of the housing 6, a fitting load, which originates in the engagement (see FIG. 1) of the female tabs 7 with the male tabs 5, can be caught by the butt parts 15, so that the box part 20 can be prevented from being deformed.

Figure 4:
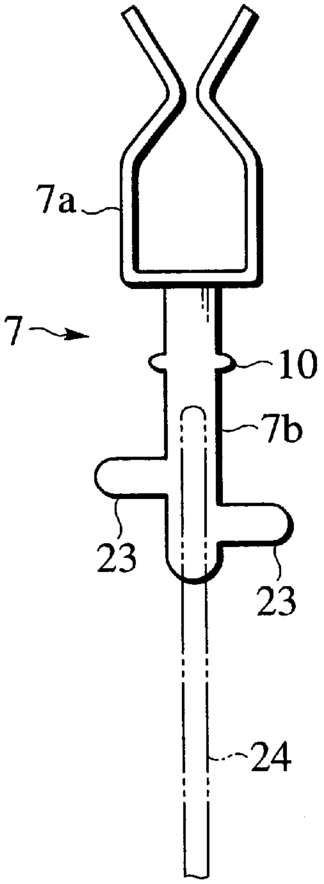
FIG. 4 is a side view showing a modification of a leg part of the female tab.

FIG. 4 shows a modification of the leg part 7*b* of the female tab 7. In the modification, a pair of crimping pieces 23 are formed on both sides of the leg part 7*b*. By crimping the pieces 23 while interposing a wire 24 therebetween, the female tab 7 can be connected to the wire 24. In this way, owing to the provision of the crimping pieces 23, the female tab 7 can be used for an electrical connection between the tab and the wire except the connection between the tab and the substrate. Note, the above-mentioned structure is also applicable to the box-shaped female tab 7 of FIG. 3.

It will be understood by those skilled in the art that the foregoing description are preferred embodiments of the disclosed connector. Various changes and modifications may be made to the present invention without departing from the spirit and scope of the invention.

What is claimed is:

1. A connector structure having a male connector attached to a substrate and a female connector attached to another substrate for engagement with the male connector, both of the substrates being connectable with each other through the male connector and the female connector under engagement condition, the male connector of the connector structure comprising:

a male housing in which a plurality of tab accommodating chambers are successively defined by partition walls constituting the male housing; and a plurality of resilient female tabs to be inserted into the tab accommodating chambers and accommodated therein, respectively;

wherein the tab accommodating chambers are partially exposed to an exterior of the male housing through respective opened outside portions of the tab accommodating chambers, and wherein the opened outside portions are successively arranged along a longitudinal direction of the male housing.

2. A connector structure as claimed in claim 1, wherein the female connector includes a plurality of male tabs for connection with the female tabs, each of the female tabs comprising:

a resilient part into which one of the male tabs is inserted; and a leg part formed integrally with a side portion of the resilient part so as to extend in one direction.

3. A connector structure as claimed in claim 2, wherein the male housing has a plurality of butt parts formed outside respective downstream ends of the tab accommodating chambers in a direction to insert the female tabs into the tab accommodating chambers, whereby the female tabs are accommodated in the tab accommodating chambers while allowing respective under faces of the resilient parts to contact with the butt parts.

4. A connector structure as claimed in claim 3, wherein each of the female tabs further comprising a pair of projections which are formed so as to project from both edges of the leg part laterally, for positioning the female tab in the tab accommodating chamber.

5. A connector structure as claimed in claim 4, wherein each of the female tabs further comprising a pair of crimping pieces which are formed so as to project from both edges of the leg part laterally, for fastening a wire on the leg part.

6. A connector structure as claimed in claim 1, wherein the female connector includes a plurality of male tabs for connection with the female tabs, each of the female tabs comprising:

a box part into which one of the male tabs is inserted, the box part having one side portion opened to the outside;

a resilient part formed integrally with the box part and folded back into the box part; and a leg part formed integrally with a lower portion of the box part so as to extend in one direction.

7. A connector structure as claimed in claim 6, wherein the male housing has a plurality of butt parts formed outside respective downstream ends of the tab accommodating chambers in a direction to insert the female tabs into the tab accommodating chambers, whereby the female tabs are accommodated in the tab accommodating chambers while allowing respective bottom sides of the box parts to contact with the butt parts.

8. A connector structure as claimed in claim 7, wherein each of the female tabs further comprising a pair of projections which are formed so as to project from both edges of the leg part laterally, for positioning the female tab in the tab accommodating chamber.

9. A connector structure as claimed in claim 8, wherein each of the female tabs further comprising a pair of crimping pieces which are formed so as to project from both edges of the leg part laterally, for fastening a wire on the leg part.

* * * * *